(12) United States Patent
Mathai et al.

(10) Patent No.: US 9,014,519 B2
(45) Date of Patent: Apr. 21, 2015

(54) OPTOELECTRONIC INTERFACE

(75) Inventors: Sagi Varghese Mathai, Berkeley, CA (US); Michael Renne Ty Tan, Menlo Park, CA (US); Paul Kessler Rosenberg, Sunnyvale, CA (US); Wayne V. Sorin, Mountain View, CA (US); Georgios Panotopoulos, Berkeley, CA (US); Susant K. Patra, Brentwood, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 492 days.

(21) Appl. No.: 13/273,983

(22) Filed: Oct. 14, 2011

(65) Prior Publication Data
US 2013/0094799 A1    Apr. 18, 2013

(51) Int. Cl.
*G02B 6/12* (2006.01)
*G02B 6/36* (2006.01)
*G02B 6/42* (2006.01)

(52) U.S. Cl.
CPC .............. *G02B 6/423* (2013.01); *G02B 6/4232* (2013.01); *G02B 6/4249* (2013.01)

(58) Field of Classification Search
None
See application file for complete search history.

(56) References Cited

U.S. PATENT DOCUMENTS

| | | | | |
|---|---|---|---|---|
| 5,428,704 A | * | 6/1995 | Lebby et al. | 385/92 |
| 6,015,239 A | * | 1/2000 | Moore | 385/92 |
| 6,821,028 B2 | | 11/2004 | Morris et al. | |
| 6,915,049 B2 | * | 7/2005 | Murata | 385/52 |
| 6,931,181 B2 | | 8/2005 | Jewell et al. | |
| 6,960,032 B2 | | 11/2005 | Eldring et al. | |
| 6,987,619 B2 | * | 1/2006 | Kornrumpf et al. | 359/619 |
| 7,137,746 B2 | | 11/2006 | Kato | |
| 7,221,829 B2 | * | 5/2007 | Oono et al. | 385/52 |
| 7,350,983 B2 | * | 4/2008 | Saitoh et al. | 385/88 |
| 7,418,175 B2 | * | 8/2008 | Aizpuru et al. | 385/52 |
| 7,720,337 B2 | * | 5/2010 | Lu et al. | 385/52 |
| 2002/0054737 A1 | * | 5/2002 | Jian | 385/49 |
| 2004/0228588 A1 | * | 11/2004 | Eldring et al. | 385/94 |
| 2004/0240777 A1 | * | 12/2004 | Woodgate et al. | 385/16 |
| 2009/0202203 A1 | * | 8/2009 | Budd et al. | 385/33 |

* cited by examiner

*Primary Examiner* — Tina Wong
(74) *Attorney, Agent, or Firm* — Van Cott, Bagley, Cornwall & McCarthy

(57) ABSTRACT

An optoelectronic interface includes an optically transparent substrate; and an alignment layer comprising a pattern of alignment features disposed on said optically transparent substrate.

20 Claims, 13 Drawing Sheets

800

Aligning an optical signal transmission medium to an optical signal source by mating a pattern of alignment features formed on said optically transparent substrate to a corresponding pattern of alignment features on a ferrule of the optical signal transmission medium
(802)

Optically coupling an optical signal source to the optical signal transmission medium through the optically transparent substrate
(804)

*Fig. 8*

OPTOELECTRONIC INTERFACE

BACKGROUND

As the communications landscape becomes more interconnected and more data is being transmitted electronically, the demand for efficient, high quality electronic data transport has greatly increased. This demand is met, in part, by optoelectronic communication, i.e., using optical signals to transmit electronic data. This works as electronic data input is converted into light pulses which are carried to a destination by a transmission medium, such as a wave guide or fiber optic cable. Thus, the process of optoelectronic communication using optical signals includes converting the data to be transported into an optical signal, transferring that optical signal onto a transmission medium configured to carry it and relaying that optical signal to a specified destination. Data communicated through optical signals may travel longer distances more quickly and is less likely to be affected by electromagnetic interference and signal degradation.

One of the challenges of optoelectronic communication is aligning the source of the optical signal with the transmission medium so that data may be transmitted along the transmission medium. If the optical signal source isn't fully aligned with the transmission medium, the optical signal may be weakened or not transmitted at all. Therefore, proper alignment between the signal source and transmission medium, also known as optical coupling, is needed before the optoelectronic communication can occur.

This optical coupling typically involves actively aligning the optical signal from the source with the transmission medium. This process can be tedious, time consuming, and costly as a high degree of precision may be needed to adequately couple the optical signal into the transmission medium. Such costly, time-consuming work decreases the production of such communication links.

BRIEF DESCRIPTION OF THE DRAWINGS

The accompanying drawings illustrate various examples of the principles described herein and are a part of the specification. The illustrated configurations are merely examples and do not limit the scope of the claims.

FIG. 8 is a flowchart showing an illustrative method for constructing an optoelectronic interface, according to one example of principles described herein.

Throughout the drawings, identical reference numbers designate similar, but not necessarily identical, elements.

DETAILED DESCRIPTION

Figure 1:
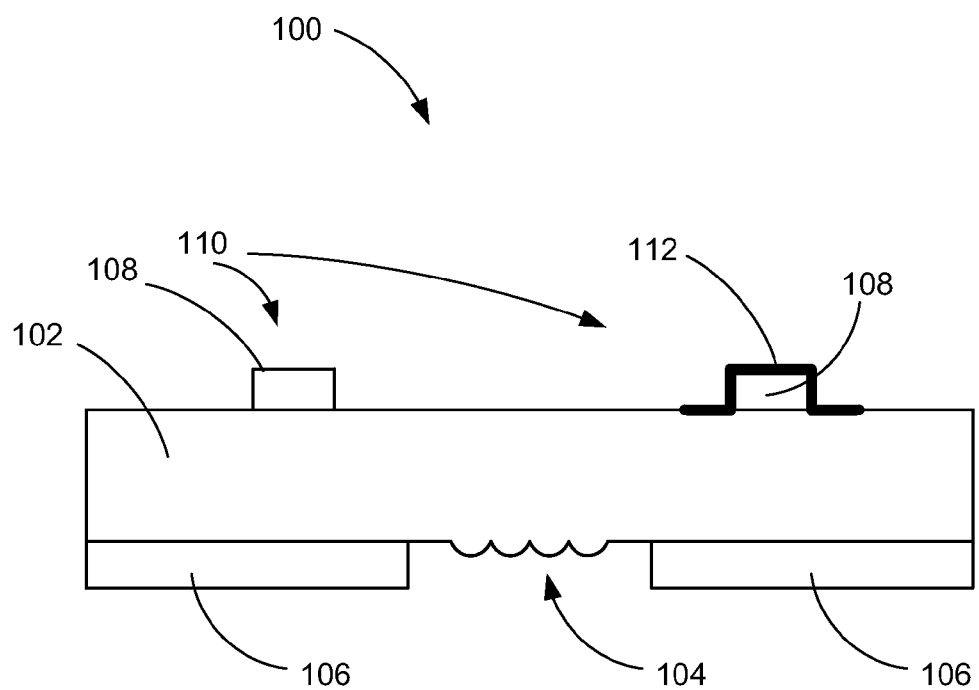
FIG. 1 is a cross-sectional diagram of an illustrative opto-mechanical bench, according to one example of principles described herein.

As noted above, optical signals have been developed as a solution to the ever-growing global need for electronic data transmission. Optical signals provide large bandwidth, thereby facilitating greater quantities of data transfer, and are less prone to signal degradation and electromagnetic interference.

However, as noted above, before a transmission medium can relay the data, the optical signal must be transferred from its source into the transmission medium. Optoelectronic interfaces may be used to facilitate this transfer by aligning the source with the transmission medium. This alignment can prove difficult and is typically done by actively aligning the source with the transmission medium or by permanently attaching highly precise molded parts directly to the interface. This active alignment requires a high degree of precision and is difficult, time-consuming, and costly.

In light of these and other issues, the present specification discloses principles that enhance the efficiency of optoelectronic communication by simplifying the alignment process of the signal source and transmission medium. According to certain examples, the optoelectronic interface includes an optically transparent substrate having a top surface and a bottom surface. This optically transparent substrate provides stability to the optoelectronic interface while allowing an optical signal to pass from the source to the transmission medium.

More specifically, the optoelectronic interface includes the combination of the transparent substrate, a silicon substrate, and associated alignment features to attach optical fibers and optoelectronic devices. Optoelectronic devices may include, but are not limited to, vertical cavity surface emitting lasers, edge emitting laser, light emitting diodes, photodetectors, phototransistors, or combinations thereof. In such an example, a silicon substrate is joined to a portion of the bottom surface of the optically transparent substrate. This silicon substrate is constructed to allow attachment of an optical signal source to the optoelectronic interface. An alignment device is then joined to the top surface of the optically transparent substrate. Through this alignment device a transmission medium may attach to the optoelectronic interface, also known as an opto-mechanical bench, and receive the optical signal from the source. The alignment device may be positioned such that when the transmission medium is attached to the interface, it is aligned or optically coupled with the optical source.

Because the transmission medium and the source are passively aligned upon attachment through the alignment device, no active alignment of the transmission medium and source is needed. Thus, the time to align the transmission medium with the source is reduced and the complexity of the tools, machines and labor needed to perform the alignment are reduced. This decreases the cost of alignment and likewise reduces the cost of optoelectronic communication.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with an example is included in at least that one example, but not necessarily in other implementations.

Throughout this specification and in the appended claims, the term "photoresist" refers to any light-sensitive material that changes its properties in response to exposure to a particular wavelength or intensity of light or other electromagnetic radiation. In the present specification, photoresist is used to transfer a desired pattern to an underlying substrate. The photoresist is exposed to a pattern of light corresponding to the desired pattern. For example in the case of positive tone photoresist, the exposed portion of the photoresist is then soluble to a chemical developer solution, while the unexposed portion is insoluble to the developer solution. Alternatively, negative tone photoresist can be used in which the exposed portion of the photoresist becomes insoluble in the chemical developer solution, leaving the unexposed portion after developing. In either case, the exposure pattern and subsequent application of the developer solution is arranged to leave a pattern of insoluble photoresist that can be used to provide alignment features as disclosed herein.

Additionally, throughout this specification and in the appended claims, the term "wafer bond" refers to manufacturing processes that are used to bond thin substrates of similar or dissimilar material to one another.

Lastly, throughout this specification and in the appended claims, the term "flip-chip" refers to a process in which semiconductor devices are electronically connected. This flip-chip process includes placing an electrical trace and under bump metals on the surface of a first optoelectronic device and on the surface of a second substrate, and then placing an accumulation of solder on the under bump metals on the surface of the first optoelectronic device, second substrate, or first optoelectronic device and second substrates. The process the includes turning the optoelectronic device over; aligning the solder with the electrical traces and under bump metal of the second substrate, and melting and solidifying the solder bumps to complete the connection. The electrical traces may be precisely fabricated on corresponding optoelectronic devices and substrates through various processes including, but not limited to photolithography.

Referring now to the figures, FIG. 1 is a cross-sectional diagram of an illustrative opto-mechanical bench (100). According to certain examples, the opto-mechanical bench (100) includes an optically transparent substrate (102). The optically transparent substrate (102) adds mechanical strength to the opto-mechanical bench, prevents dust and debris from contaminating the optoelectronic devices, may be wiped clean, and does not interfere with the optical transfer of information from an optical source to an optical signal transmission medium.

The optically transparent substrate (102) could be constructed using any number of optically transparent materials. For example, the optically transparent substrate (102) may be made of glass, plastic or any other material that would allow an optical signal to pass through substantially uninterrupted.

A portion of the bottom surface of the optically transparent substrate (102) includes a microlens array (104). In various examples, the microlens array may be a refractive microlens array, diffractive microlens array, or high contrast grating microlens array. In the illustrated example, the differing refractive indices of the air and microlens array (104) causes the optical signal to change its propagation characteristics as it passes through the microlens array (104). By selecting certain characteristics of the microlens array (104), the optical signal can be directed from an optical signal source to an optical signal transmission medium as desired.

In this example, the microlens array may be formed by various mechanical processes that include, but are not limited to, photolithography, molding or etching. However, any other methods of forming the microlens array may be used within the principles disclosed herein.

As noted above, silicon substrate (106) is attached to the bottom surface of the optically transparent substrate (102). In certain examples, the silicon substrate (106) may be attached to the optically transparent substrate (102) using a wafer bond. The silicon substrate (106) provides a surface where an optical signal source may be mechanically attached to the opto-mechanical bench (100) and provides the offset distance needed between the optoelectronic device and the microlens.

The silicon substrate (106) may include an aperture aligned with the microlens array (104) that allows the optical signal to travel from the signal source through the optically transparent substrate (102) to a transmission medium. This silicon substrate and aperture may be formed by various mechanical processes including, but not limited to, photolithography, wet etching, laser micromachining, and deep reactive ion etching.

In certain examples, the opto-mechanical bench (100) may include an alignment device (110) attached to the top surface of the optically transparent substrate (102). The alignment device may be fabricated using methods such as, but not limited to, photolithography, molding, etching, and electroplating. The alignment devices are precisely aligned to the microlenses. As will be described and illustrated in detail below, the alignment device aligns a transmission medium with an optical signal source. As noted above, if the transmission medium is not aligned with the optical signal source, the optical signal cannot be transmitted or may be reduced in intensity thereby negatively effecting transmission of the signal.

The alignment device (110) includes a pattern of features that corresponds to a pattern of features on a ferule, connector, or coupler of an optical signal transmission medium. Consequently, when the pattern of features on the alignment device is mated with corresponding pattern of features on the coupler of the transmission medium, the transmission medium is aligned with respect to the optically transparent substrate (102) and the microlens array (104).

In the example of FIG. 1, the alignment device (110) includes posts (108) that are sized and arranged to mate with holes on the coupler of the transmission medium. Alternatively, the alignment device on the opto-mechanical bench may include holes that are sized and arranged to mate with corresponding posts on the coupler of the transmission medium. Both alternatives will be illustrated in various examples discussed below. While FIG. 1 depicts two regularly shaped alignment posts (108), any number of alignment features of any shape may be utilized.

In certain examples, the alignment device (110) may be made of photoresist. Such an alignment device may be formed on the optically transparent substrate (102) through various manufacturing processes including, but not limited to, photolithography.

In some examples, the features of the alignment device (e.g., post 108), particularly if made of photoresist, may be covered with a metallic cap (112). This metallic cap (112) would add strength and stability to the feature (108) further enhancing the mechanical strength of the alignment device (110). The metallic cap may be formed by, for example, ebeam evaporation, sputtering, or electroplating.

In another example, the alignment device (110) may be made of a semiconductor material, such as silicon. In this example, the silicon may be wafer-bonded to the optically transparent substrate (102). Because of the manufacturing techniques involved, an alignment device (110) made of silicon could be constructed to increased dimensions. The increased dimensions would improve the mechanical alignment properties of the alignment device (110).

Because the alignment devices (110) may be constructed out of photoresist or silicon, construction is simple and inexpensive. Such construction allows for alignment features with simple and complex shapes to be fabricated at the wafer scale. This reduces the time and cost involved in manufacturing the opto-mechanical bench (100) and similarly reduces the cost of optoelectronic communication.

Figure 1A:
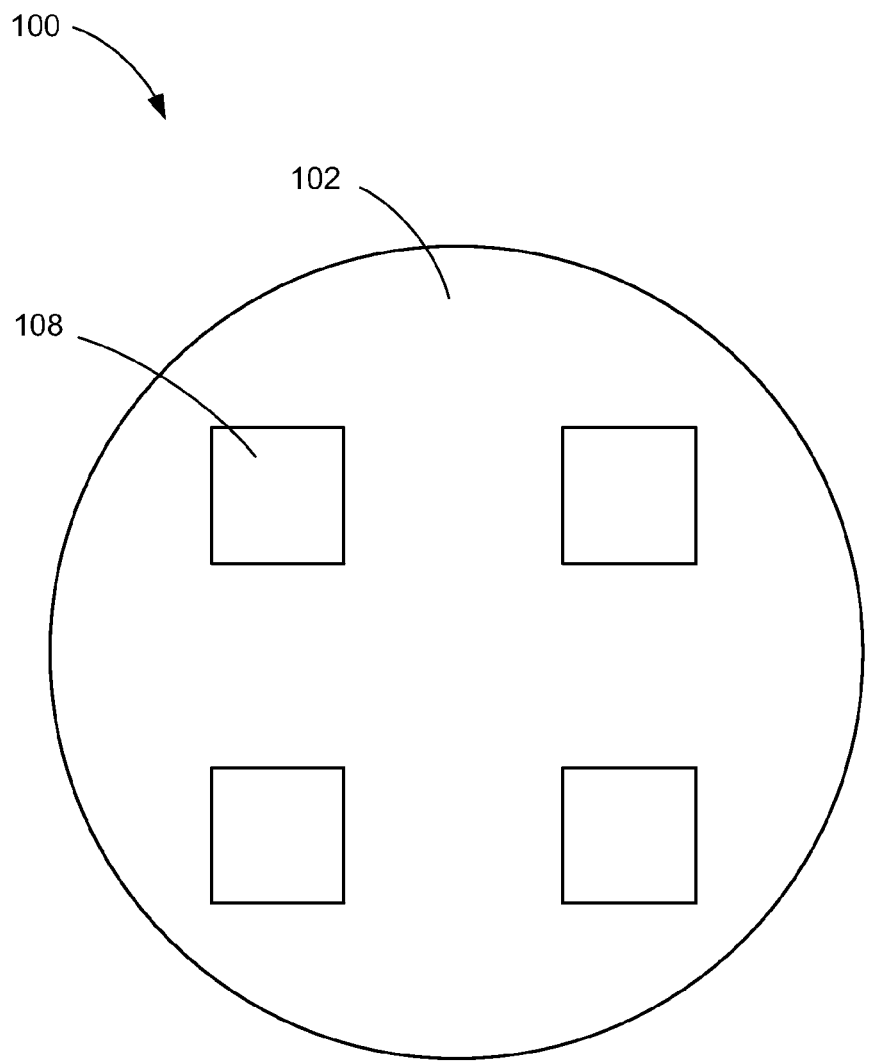
FIG. 1A is a top view of an illustrative opto-mechanical bench, according to one example of principles described herein.

FIG. 1A is a top view of one example of an opto-mechanical bench (100) as disclosed herein. The elements illustrated may also represent a subregion of a larger substrate on which multiple opto-mechanical benches are formed. In the example of FIG. 1A, the optically transparent substrate (102) supports an alignment device including four posts or features (108). It should be noted that while FIG. 1A depicts a circular optically transparent substrate (102), any shape may be utilized. Additionally, while FIG. 1A depicts four square alignment features (108), any number of alignment features of any shape may be utilized in any configuration, with corresponding features being formed on the ferule or coupler of the transmission medium, as described further below.

Figure 2:
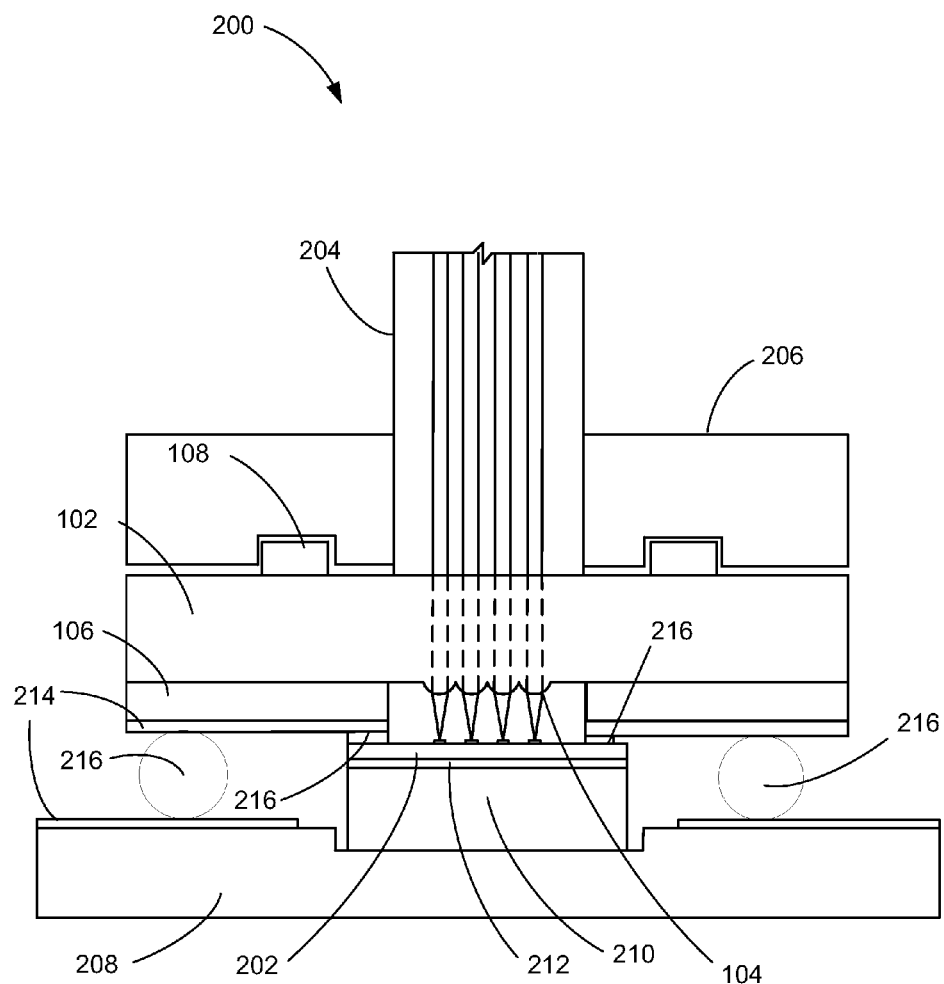
FIG. 2 is a cross-sectional diagram of an illustrative optoelectronic interface, according to one example of principles described herein.

FIG. 2 is a cross-sectional diagram of an illustrative optoelectronic interface (200). The optoelectronic interface (200) may include the optically transparent substrate (102), microlens array (104), silicon substrate (106), alignment features (108), electrical traces, under bump metals, and solder bumps as described above.

The system may further include an optical signal source (202) which converts electronic data into an optical signal. Examples of this optical signal source (202) include, but are not limited to, vertical cavity surface emitting lasers, laser diodes, and light emitting diodes. The optical signal source may be singlets or arrays. As described below the optical signal source (202) is communicatively coupled to an electronic data source (208), such as a printed circuit board, flex circuit, processor, buffer or other logic circuit. In other examples, the optical signal source may be replaced with an optical signal detection device such as, but not limited to, photodetectors or phototransistors. Further examples may include both optical signal sources and detectors to form a transceiver.

After the optical signal is created at the optical signal source (202), it passes through the microlens array (104) of the optically transparent substrate (102). The microlens array (104) may collect, collimate, or focus the optical signal before it passes through the substrate (102) and into the transmission medium (204). The transmission medium (204) then relays the data to a desired destination.

The transmission medium (204) may further include a ferrule or coupler (206) that attaches the transmission medium (204) to the opto-mechanical bench (FIG. 1, 100). In the illustrated example, the ferrule (206) includes alignment features, in this example, apertures that corresponds to the posts (108) of the opto-mechanical bench (FIG. 1, 100). As the transmission medium (204) is positioned adjacent to the opto-mechanical bench (FIG. 1, 100), the ferrule (206) apertures and the posts (108) of the bench's alignment device engage to position the transmission medium (204) in line with the optical signal as transmitted from the optical signal source (202) through the transparent substrate (102).

Thus, active alignment of the transmission medium (204) with the optical signal source (202) is not needed. Because active alignment is no longer required, the time and cost to implement optoelectronic communication is reduced.

A heat sink (210) may be attached to the optical signal source (202). A thermal interface (212) may be placed between the heat sink (210) and the optical signal source (202) to improve heat transfer out of the optical signal source to protect the optical signal source (202) from overheating.

The opto-mechanical bench (FIG. 1, 100), optical signal source (202), and data source (208) may be mechanically connected to one another using a flip-chip connection through a series of electrical traces (214) and solder bumps (216). This occurs as the electrical traces (214) located on the silicon substrate (106) and the data sources (208) are joined with solder bumps (216). This flip-chip connection also electronically couples the data source (208) to the optical signal source (202). This allows the optical signal source (202) to receive data from the data source (208) and convert it into an optical signal to be transported along the transmission medium (204).

Figure 3:
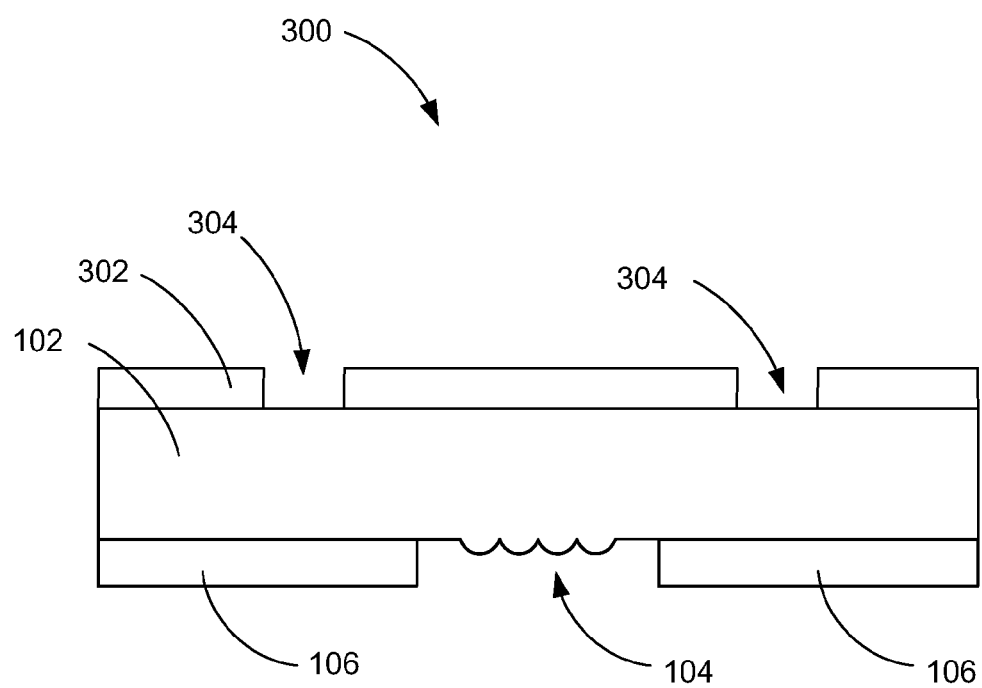
FIG. 3 is a cross-sectional diagram of an illustrative opto-mechanical bench, according to one example of principles described herein.

FIG. 3 is a cross-sectional diagram of another illustrative opto-mechanical bench (300). According to certain examples of the principles disclosed herein, the opto-mechanical bench (300) may include the optically transparent substrate (102), microlens array (104) and silicon substrate (106) as described above.

The opto-mechanical bench (300) may also include an alignment substrate (302) attached to the top surface of the optically transparent substrate (102). The alignment substrate may be glass, semiconductor, plastic, etc. The alignment substrate (302) may include alignment apertures (304) to align the ferrule or coupler of the transmission medium with the optical signal source. While FIG. 3 depicts a pair of regularly shaped alignment apertures, any number of alignment apertures of any shape may be utilized. In alternative examples, a large aperture may be formed to allow optical signals to pass through the alignment substrate In some examples, the alignment substrate (302) or selected features thereon, such as the apertures (304), may be covered with a metallic cap, as described above. This metallic cap would add strength and stability to the alignment substrate (302) further enhancing the mechanical robustness of the alignment substrate (302).

In the illustrated example, the alignment substrate (302) may be made of an optically transparent photoresist. By using an optically transparent material, the optical signal may pass through the optically transparent substrate (102) and the alignment substrate (302) to the transmission medium. In this example, the alignment substrate (302) and corresponding apertures may be formed on the optically transparent substrate (102) using various mechanical processes including, but not limited to, photolithography. In other embodiments, the alignment substrate may be wafer bonded to the transparent substrate.

Figure 3A:
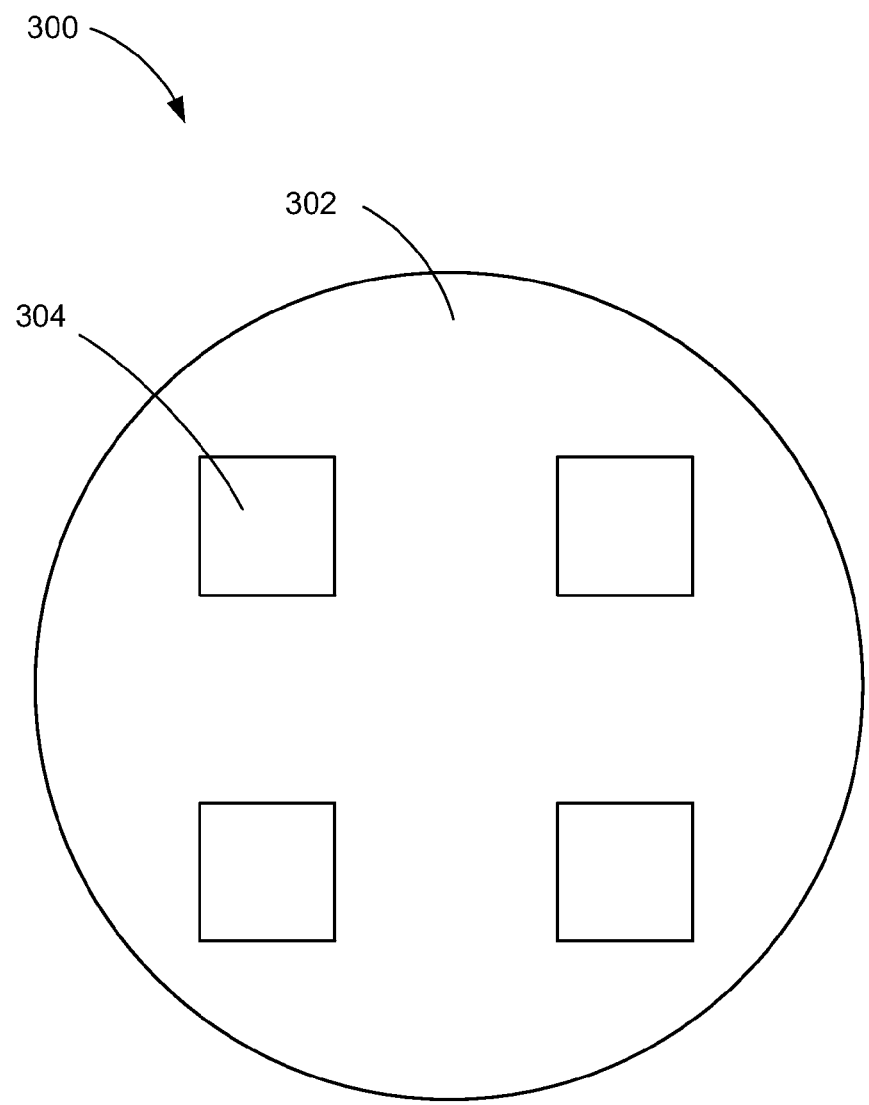
FIG. 3A is a top view of an illustrative opto-mechanical bench, according to one example of principles described herein.

FIG. 3A is a top view of an illustrative opto-mechanical bench (300). As above, this view may represent one opto-mechanical bench on a larger substrate where a number of similar benches have been formed. In FIG. 3A, an alignment substrate (302) is shown having four alignment apertures (304) formed therein. It should be noted that while FIG. 3A depicts a circular alignment substrate (302), any shape may be utilized. Additionally, while FIG. 3A depicts four square alignment apertures (304), any number of alignment apertures of any shape may be utilized in any orientation.

Figure 4:
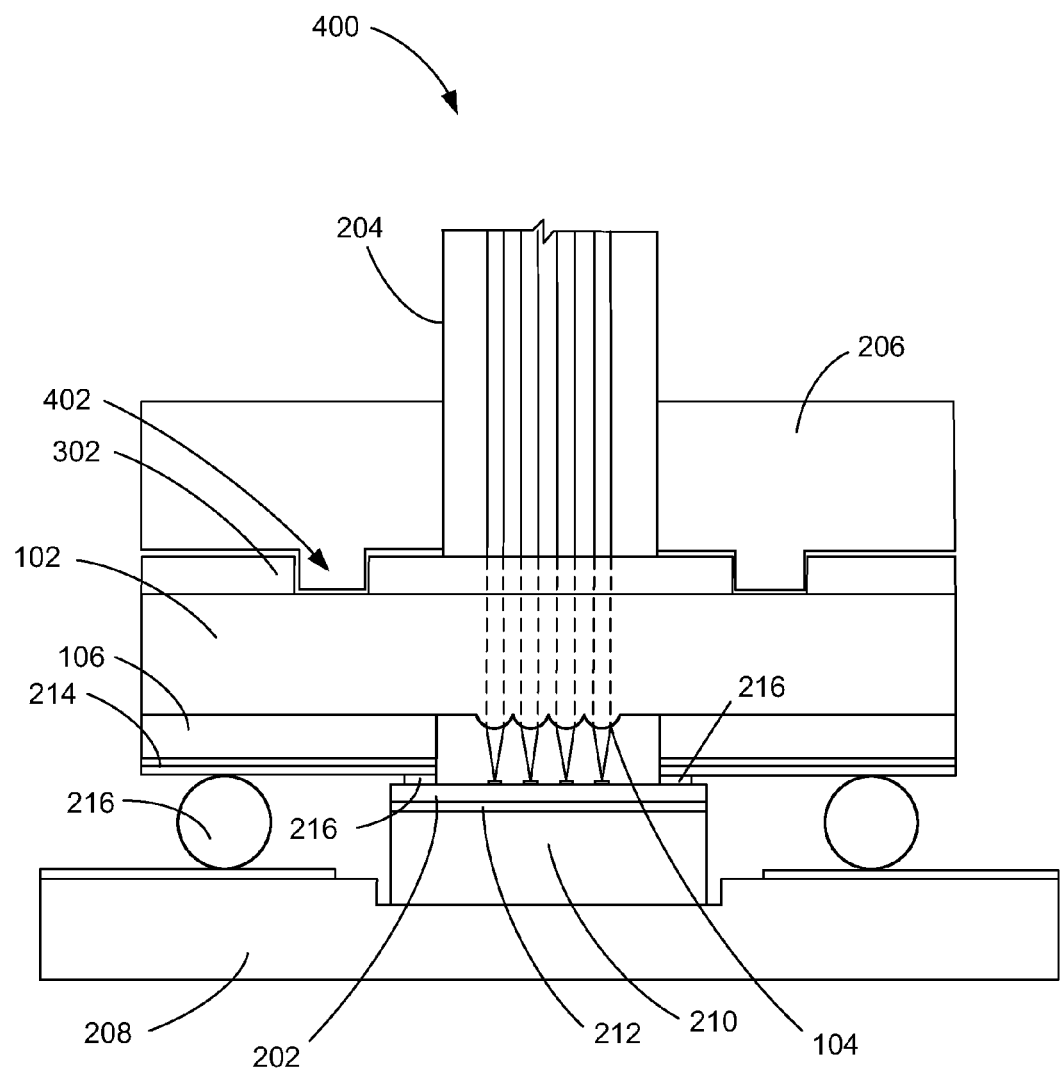
FIG. 4 is a cross-sectional diagram of an illustrative optoelectronic interface, according to one example of principles described herein.

FIG. 4 is a cross-sectional diagram of an illustrative optoelectronic interface (400). The optoelectronic interface (400) may include the optically transparent substrate (102), microlens array (104), silicon substrate (106), optical signal source (202), transmission medium (204), ferrule (206), electronic component (208), heat sink (210), thermal interface material (212), electrical traces (214), under bump metals, and solder bumps (216) as previously described.

According to certain examples, the ferrule (206) may include an alignment device (402) with posts that correspond to the apertures in the alignment substrate (302). As the transmission medium (204) is positioned adjacent to the opto-mechanical bench (FIG. 3, 300), the alignment device (402) and the apertures of the alignment substrate (302) position the transmission medium (204) in line with the optical signal as emitted by the optical signal source (202).

Thus, active alignment of the transmission medium (204) with the optical signal source (202) is not needed. As described above, because active alignment of the transmission medium and optical signal source is not needed, cheaper, more efficient optoelectronic communication is facilitated. In this example, the electronic component (208) may be attached to the silicon substrate (106) using the flip-chip connection described above.

Figure 5:
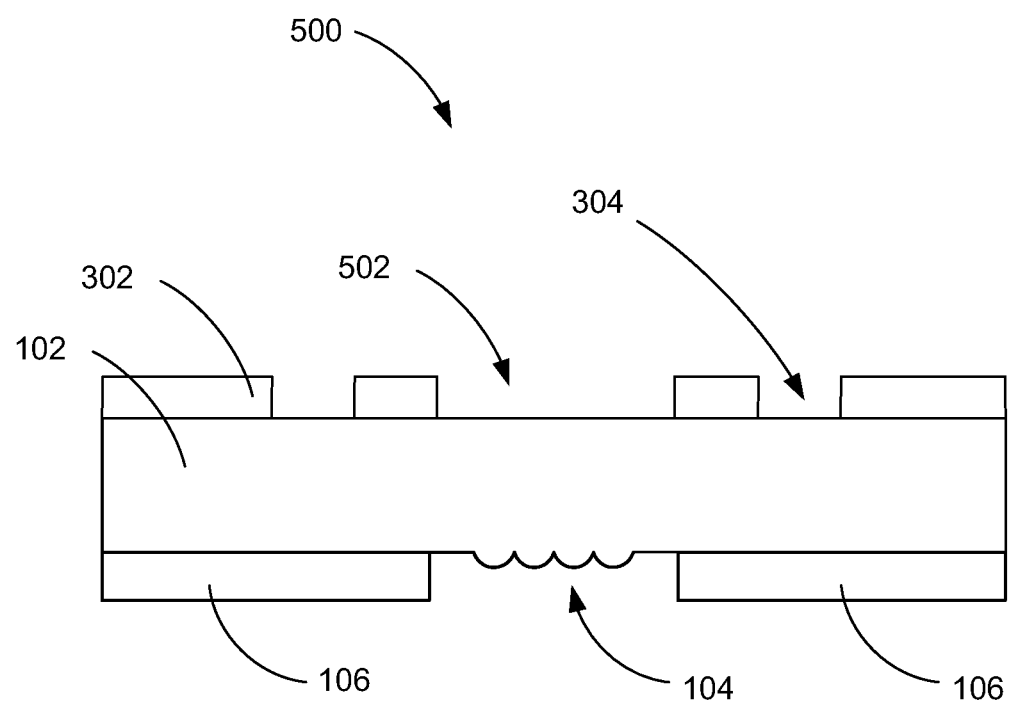
FIG. 5 is a cross-sectional diagram of an illustrative opto-mechanical bench, according to one example of principles described herein.

FIG. 5 is a cross-sectional diagram of an illustrative opto-mechanical bench (500). According to certain examples of the principles disclosed herein, the opto-mechanical bench (500) may include the optically transparent substrate (102), microlens array (104), silicon substrate (106), and alignment substrate (FIG. 3, 302) with its corresponding apertures as described above.

In certain examples the alignment substrate (302) may further include a transmission medium aperture (502) through which the transmission medium may align and connect with the opto-mechanical bench (500). In addition to the alignment apertures, the transmission medium aperture (502) provides another mechanism to align and mechanically stabilize the transmission medium. This further assures that the transmission medium will be aligned with the optical signal source, such that an optical signal can be relayed to the desired destination. While FIG. 5 depicts the alignment features, such as apertures (304) and (502) as extending through the full depth of the alignment substrate (302), another example may include alignment apertures that extend through a portion of the depth of the alignment substrate.

According to certain examples the apertures in the alignment substrate may be made of silicon or a photoresistive material. In this example, the alignment apertures and the transmission medium aperture (502) may be formed by various manufacturing processes including but not limited to photolithography, deep reactive ion etching, or mechanical drilling.

Figure 5A:
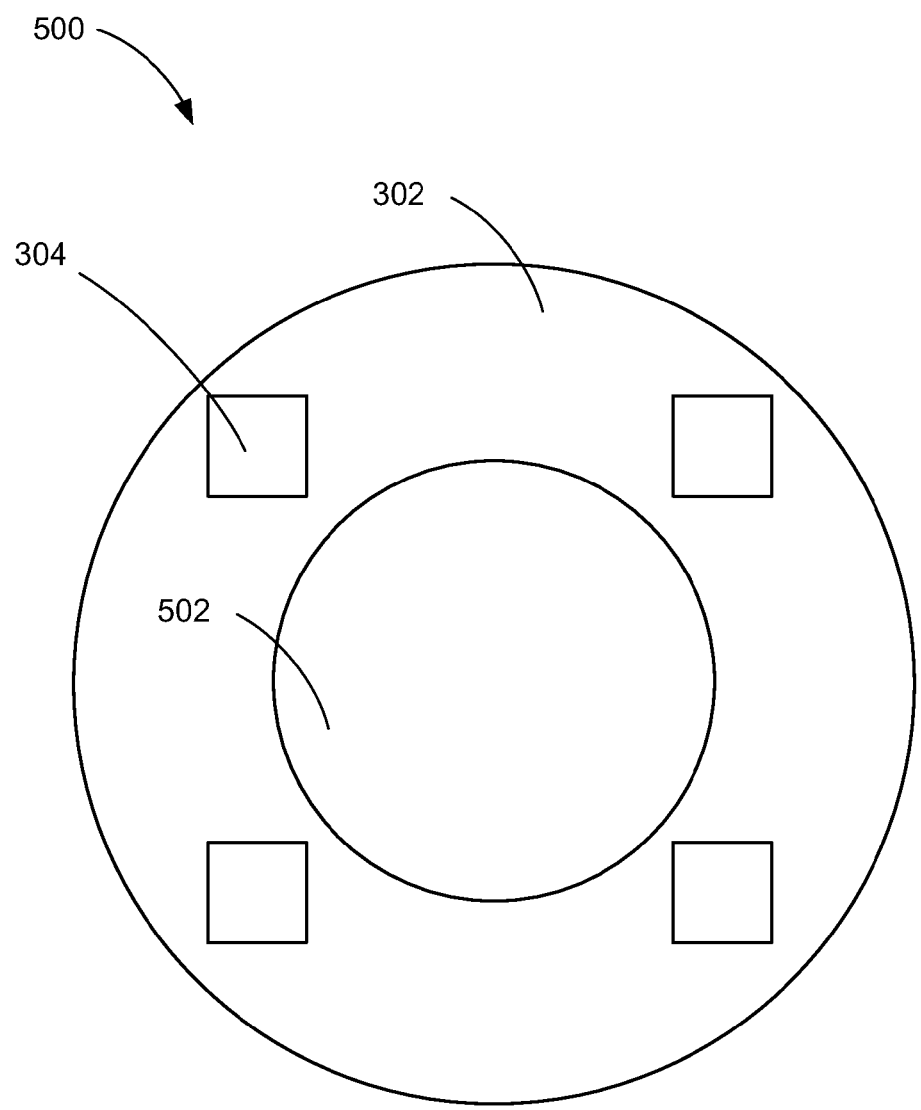
FIG. 5A is a top view of an illustrative opto-mechanical bench, according to one example of principles described herein.

FIG. 5A is a top view of the illustrative opto-mechanical bench (500). Depicted are the alignment substrate (302) with its corresponding alignment apertures (304), and the transmission medium aperture (502). It should be noted that while FIG. 5A depicts a circular alignment substrate (302), any shape may be utilized. Additionally, while FIG. 5A depicts four square alignment apertures (304), any number of alignment features of any shape may be utilized in any configuration. This view may represent one opto-mechanical interface on a larger substrate where a number of similar interfaces have been formed.

Figure 6:
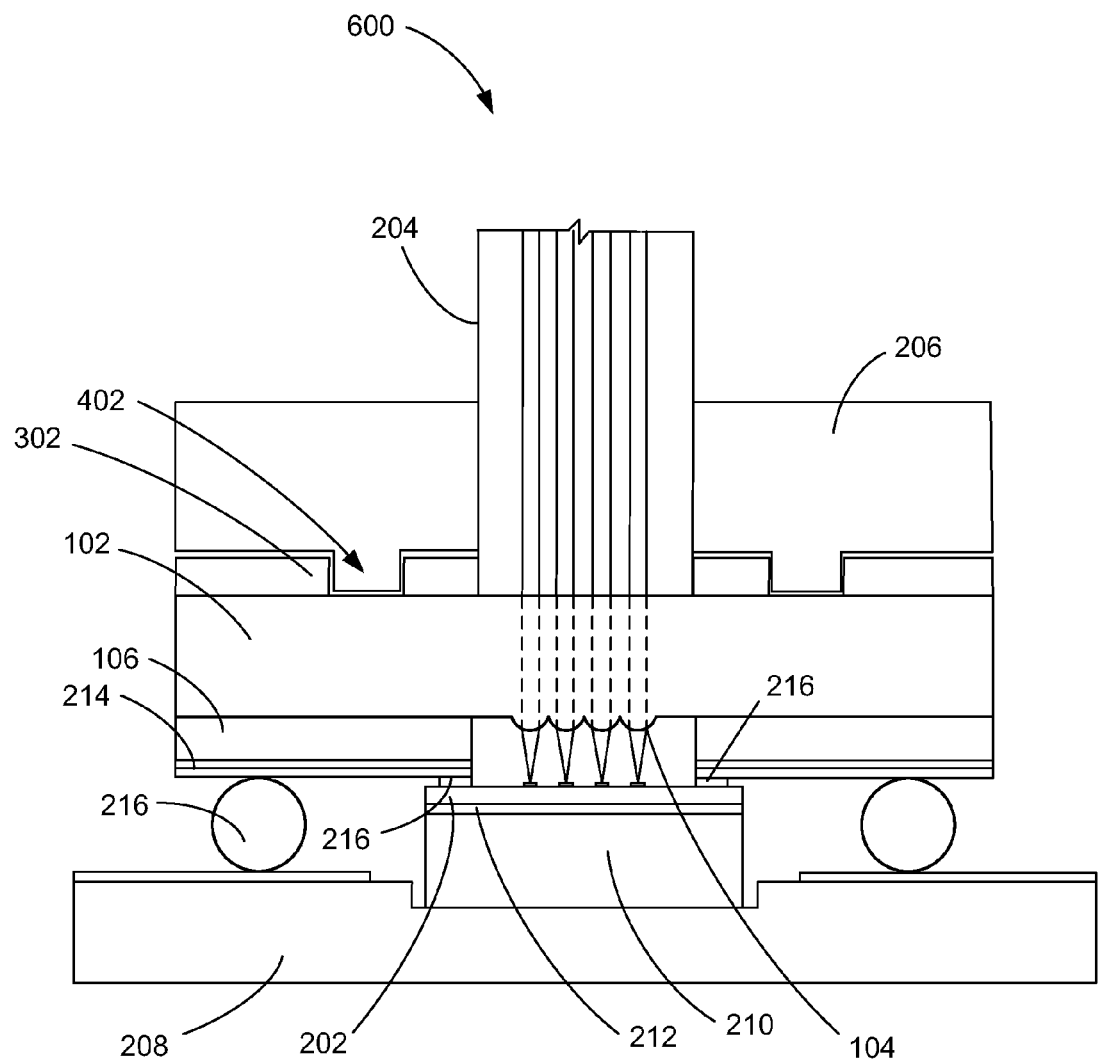
FIG. 6 is a cross-sectional diagram of an illustrative optoelectronic interface, according to one example of principles described herein.

FIG. 6 is a cross-sectional diagram of an illustrative optoelectronic interface (600). The optoelectronic interface (600) may include the optically transparent substrate (102), microlens array (104), silicon substrate (106), optical signal source (202), transmission medium (204), ferrule or coupler (206), electronic data source (208), heat sink (210), thermal interface (212), electrical traces (214), solder bumps (216), alignment substrate (302) with corresponding apertures, alignment features (402) and transmission medium aperture (FIG. 5, 502) as described above.

As the transmission medium (204) is positioned adjacent to the opto-mechanical bench (FIG. 5, 500), the alignment features (402) and the transmission medium aperture (FIG. 5, 502) of the alignment substrate (302) position the transmission medium (204) in line with the optical signal as emitted by the optical signal source (202). Thus, active alignment of the transmission medium with the optical signal source is not needed. In this example, the electronic component (208) may be attached to the silicon substrate (106) using the flip-chip connection described above.

Figure 7:
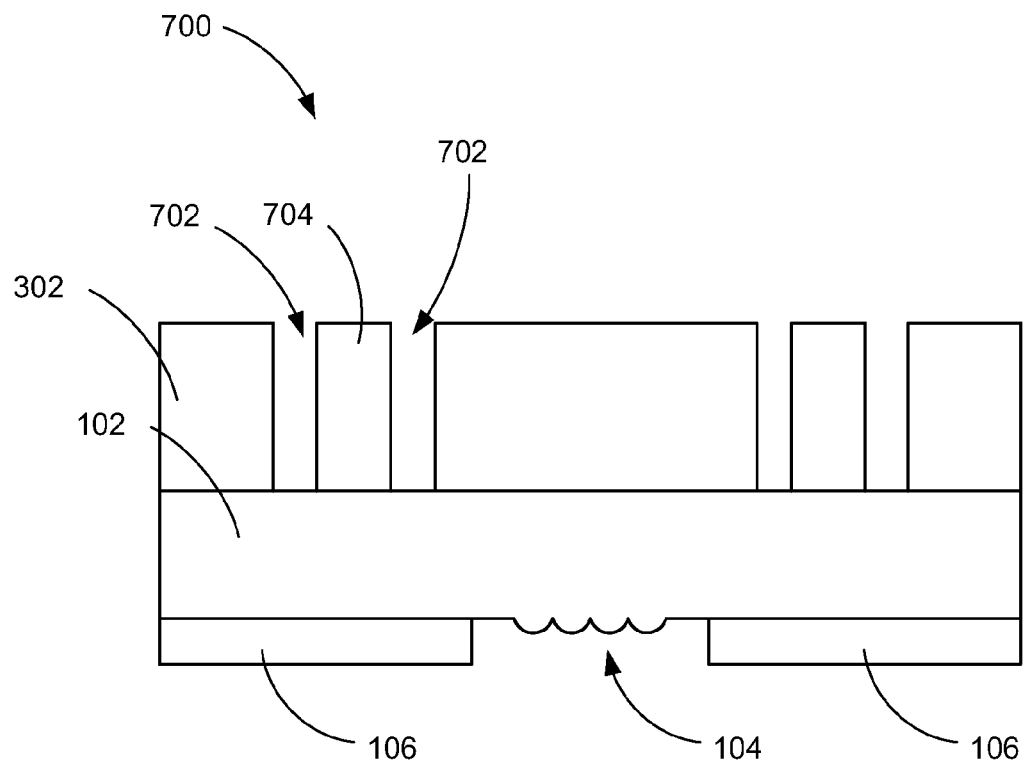
FIG. 7 is a cross-sectional diagram of an illustrative opto-mechanical bench, according to one example of principles described herein.

FIG. 7 is a cross-sectional diagram of an illustrative opto-mechanical bench (700). According to certain examples of the principles disclosed herein, the opto-mechanical bench (700) may include the optically transparent substrate (102), microlens array (104), silicon substrate (106), and alignment substrate (302) with corresponding alignment features as described above.

In certain examples the alignment substrate (302) may include alignment grooves (702) to align the ferrule or coupler of the transmission medium with the optical signal source, such that an optical signal can be relayed to the desired destination. In the example of FIG. 7, a pair of circular alignment grooves are formed with a ring (704) that remains between the grooves (702). Again, FIG. 7 shows a cross-section of these grooves (702) and the ring (704). The circular configuration of the grooves and ring can be better appreciated in the top view of FIG. 7A, described below.

While FIG. 7 depicts two alignment grooves, any number of alignment grooves of any shape may be utilized. Additionally, while FIG. 7 depicts the alignment grooves as extending through the full depth of the alignment substrate, another example may include alignment grooves that extend through only a portion of the depth of the alignment device.

According to certain examples the apertures in the alignment substrate may be made of silicon or photoresist. In this example, the alignment grooves (702) may be formed by various manufacturing processes including but not limited to photolithography, deep reactive ion etching, or mechanical drilling.

Figure 7A:
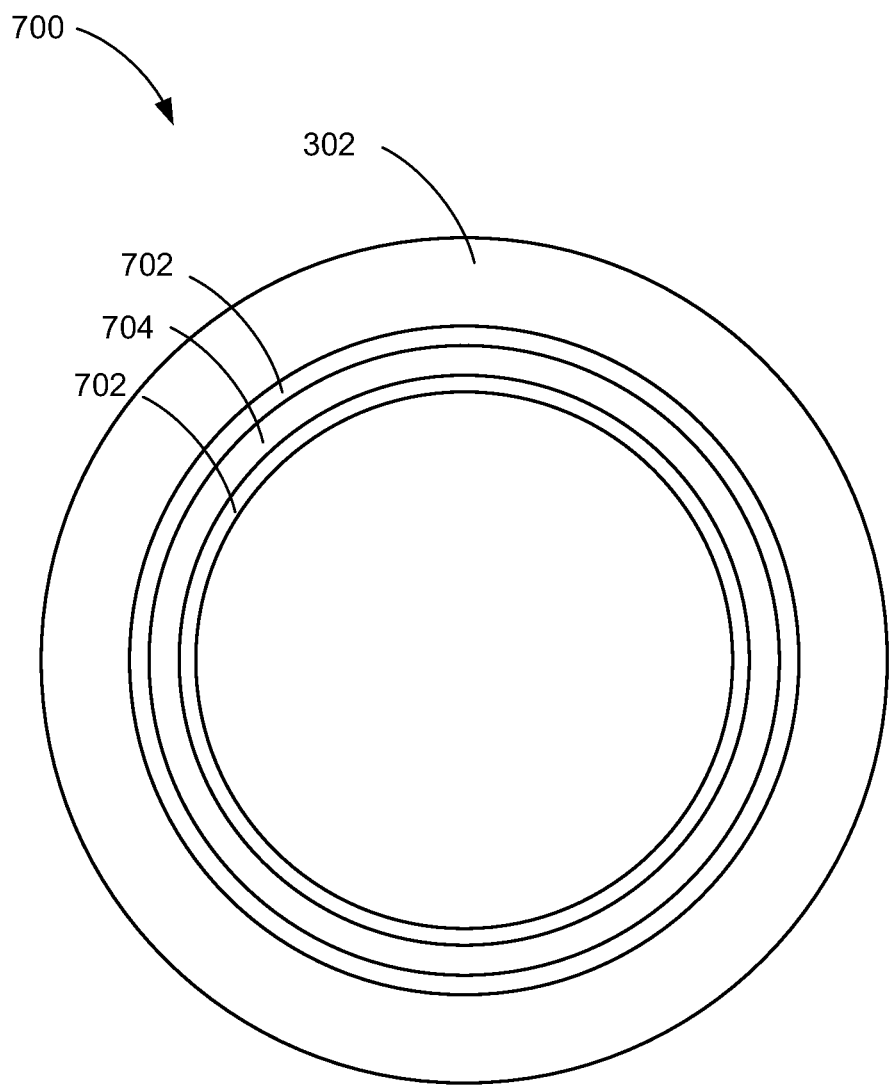
FIG. 7A is a top view of an illustrative opto-mechanical bench, according to one example of principles described herein.

FIG. 7A is a top view of the illustrative opto-mechanical bench (700). Depicted are the third substrate (302) and two alignment grooves (702), which together form an alignment ring between them. It should be noted that while FIG. 7A depicts a circular third substrate (302), any shape may be utilized. Additionally, while FIG. 7A depicts two circular alignment grooves (702), any number of alignment grooves of any shape may be utilized in any orientation.

While the present example shows alignment grooves that ring the center portion of the bench (700) where the microlens array would be located, other configurations are within the scope of this disclosure. For example, a separate alignment groove or set of grooves could be formed to the right and left of the microlens array.

FIG. 8 is a flowchart showing an illustrative method (800) for constructing an optoelectronic interface. The method (800) includes aligning an optical signal transmission medium to an optical signal source by mating a pattern of alignment features formed on said optically transparent substrate to a corresponding pattern of alignment features on a ferrule of the optical signal transmission medium (802). The method (800) further includes optically coupling an optical signal source to the optical signal transmission medium through the optically transparent substrate (804).

Figure 9:
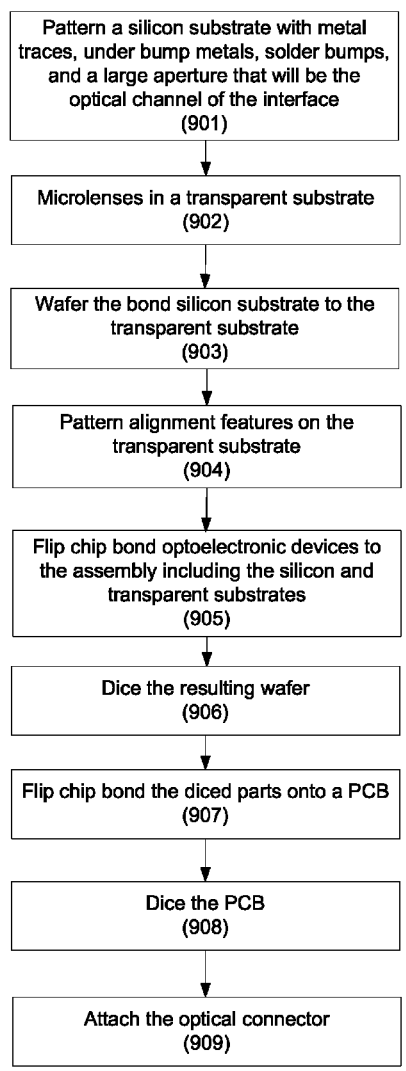
FIG. 9 is a flowchart showing an illustrative method for constructing an optoelectronic interface, according to one example of principles described herein.

FIG. 9 is a more detailed flowchart showing an illustrative method (800) for constructing an optoelectronic interface. As shown in FIG. 9, the method begins with patterning a silicon substrate with metal traces, under bump metals, solder bumps, and a large aperture that will be the optical channel of the interface (901). Next, microlenses are formed on a transparent substrate (902). After this preparation, the silicon substrate is wafer bonded to the transparent substrate such that the microlenses are precisely aligned to the patterns on the silicon substrate (903). Materials may be selected such that the coefficients of thermal expansion (CTE) of the silicon and transparent substrates are similar.

Next, the alignment features are patterned on the transparent substrate (904). The alignment features are formed on the side of the transparent substrate opposite the microlenses such that the alignment features are precisely aligned to the microlens array Then, optoelectronic devices are flip chip bonded to the assembly including the silicon and transparent substrates (905). This flip chip process is used to align the optoelectronic device to the microlens array via the solder bumps on the silicon side.

The resulting wafer is diced to separate individual interfaces (906). The diced parts are then each flip chip bonded onto a printed circuit board (PCB) panel with heat sinks (907). The PCB panel is then diced. Finally, the optical connector and associated mechanics are attached (908).

The preceding description has illustrated principles for aligning an optical signal transmission medium with an optical signal source. The apparatus may include an optically transparent substrate which is joined on one surface to a silicon substrate and joined on the other surface to an alignment device. The apparatus may then be joined along one surface to an optical signal source through the silicon substrate and to a transmission medium on the other side through the alignment device. This system is advantageous because it passively aligns the transmission medium with the optical signal source. This minimizes the alignment process as no active alignment of the two is required. Thus the cost and time required to align are reduced, and as a result, the cost of optoelectronic communication is reduced.

The preceding description has been presented only to illustrate and describe examples of the principles described. This description is not intended to be exhaustive or to limit these principles to any precise form disclosed. Many modifications and variations are possible in light of the above teaching.

What is claimed is:

1. An optoelectronic interface comprising:
   an optically transparent substrate; and
   an alignment layer coupled to a first side of the optically transparent substrate, the alignment layer comprising:
      a number of alignment features defined on said alignment layer to engage with a number of corresponding alignment features defined on a coupler of an optical signal transmission medium; and
      an aperture defined through said alignment layer to selectively and detachably receive the optical signal transmission medium completely there through;
   an optoelectronic device optically coupled to a second side of said optically transparent substrate, wherein said optical signal transmission medium is optically coupled to said optoelectronic device through said optically transparent substrate.

2. The optoelectronic interface of claim 1, further comprising a microlens array formed on said second side of said optically transparent substrate opposite said alignment layer.

3. The optoelectronic interface of claim 2, further comprising a silicon layer bonded to said optically transparent substrate around said microlens array.

4. The optoelectronic interface of claim 1, wherein said alignment layer is formed of a patterned photoresist material.

5. The optoelectronic interface of claim 1, further comprising a metal cap disposed over one of more of said alignment features defined on said photoresist material.

6. The optoelectronic interface of claim 1, wherein said alignment layer is formed of a patterned semiconductor material.

7. The optoelectronic interface of claim 6, wherein said semiconductor material comprises silicon.

8. The optoelectronic interface of claim 1, wherein said alignment features defined on said alignment layer comprise a number of posts formed to correspond to receiving apertures in said connector of said optical transmission medium.

9. The optoelectronic interface of claim 1, wherein said alignment features defined on said alignment layer comprise a number of holes formed to correspond to posts on said connector of said optical transmission medium.

10. The optoelectronic interface of claim 1, wherein said alignment features defined on said alignment layer comprise a number of posts formed to correspond to receiving holes defined in the coupler of the optical transmission medium.

11. The optoelectronic interface of claim 1, wherein said alignment features defined on said alignment layer comprise a number of grooves formed to correspond to alignment features in the coupler of the optical transmission medium.

12. The optoelectronic interface of claim 11, wherein said grooves are circular.

13. The optoelectronic interface of claim 1, wherein said coupler comprises a pattern of alignment features corresponding to said pattern of alignment features disposed on said optically transparent substrate.

14. The optoelectronic interface of claim 1, wherein an optoelectronic device is flip-chip attached to a silicon substrate coupled to said optically transparent substrate.

15. A method of forming an optoelectronic interface comprising:
   aligning an optical signal transmission medium to an optoelectronic device by mating a pattern of alignment features defined on an alignment layer coupled to a first side of said optically transparent substrate to a corresponding pattern of alignment features on a connector of said optical signal transmission medium; and
   optically coupling an optoelectronic device to said optical signal transmission medium through said optically transparent substrate;
   in which said alignment features of the alignment layer comprise an aperture defined completely through said alignment layer to pass said optical signal transmission medium completely through said alignment layer.

16. The method of claim 15, further comprising wafer bonding a substrate to support said optoelectronic device to said optically transparent substrate.

17. The method of claim 15, further comprising forming said pattern of alignment features on said alignment layer in a layer of photoresist material deposited on said alignment layer.

18. The method of claim 15, further comprising forming said pattern of alignment features on said alignment layer in a layer of semiconductor material bonded on said alignment layer.

19. An optoelectronic interface comprising:
an optically transparent substrate;
an optoelectronic device optically coupled to a first side of said optically transparent substrate; and
an optical signal transmission medium optically coupled to said optoelectronic device by passing the optical signal transmission medium completely through an aperture defined in an alignment layer coupled to a second side of said optically transparent substrate;
wherein a substrate with said optoelectronic device is attached to a semiconductor layer bonded to said optically transparent substrate.

20. The method of claim 18, wherein said alignment features comprise a number of posts formed to correspond to receiving holes defined in the connector of the optical transmission medium.

* * * * *